(12) United States Patent
Kimura et al.

(10) Patent No.: US 6,281,828 B1
(45) Date of Patent: Aug. 28, 2001

(54) ANALOG/DIGITAL CONVERTER APPARATUS

(75) Inventors: Tomohisa Kimura, Tokyo; Akira Yasuda, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/271,484

(22) Filed: Mar. 18, 1999

(30) Foreign Application Priority Data

Mar. 19, 1998 (JP) .................................................. 10-070237

(51) Int. Cl.⁷ ...................................................... H03M 1/12
(52) U.S. Cl. ............................................ 341/155; 341/156
(58) Field of Search ..................................... 341/155, 156, 341/161, 159, 158, 160; 323/297

(56) References Cited

U.S. PATENT DOCUMENTS 5,315,301 * 5/1994 Hosotani et al. ....................... 341/94
5,349,354 * 9/1994 Ito et al. .............................. 341/156
5,841,389 * 11/1998 Kinugasa et al. ..................... 341/159

FOREIGN PATENT DOCUMENTS 6-350452   12/1994   (JP) .
7-273616   10/1995   (JP) .

* cited by examiner

*Primary Examiner*—Brian Young
*Assistant Examiner*—John Nguyen
(74) *Attorney, Agent, or Firm*—Oblon, Spivak, McClelland, Maier & Neustadt, P.C.

(57) ABSTRACT

An analog/digital converter apparatus includes a reference signal generator circuit for generating a reference signal, a comparator section for determining a relationship in level between an input analog signal and the reference signal, and an encoder for converting a comparison result of the comparator section into a digital signal as an output signal. The comparator section has a comparator for comparing the input analog signal with the reference signal and a switching circuit which is interposed between the comparator and each of an input terminal for the input analog signal and a reference signal output terminal for the reference signal and used for switching the input signal lines of the comparator to compensate an equivalent input offset.

37 Claims, 10 Drawing Sheets

| INPUT | OUTPUT-1 | OUTPUT-2 |
|---|---|---|
| 0 | $X_0$ | $X_0 - 1$ |
| 1 | $X_1$ | $X_1 - 1$ |
| 2 | $X_2$ | $X_2 - 1$ |
| ⋮ | ⋮ | ⋮ |
| n−2 | $X_{n-2}$ | $X_{n-2} - 1$ |
| n−1 | $X_{n-1}$ | $X_{n-1} - 1$ |

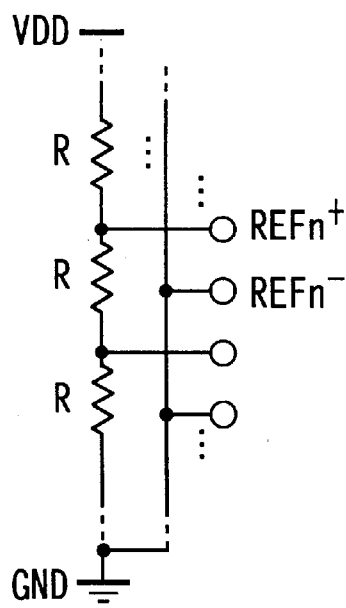 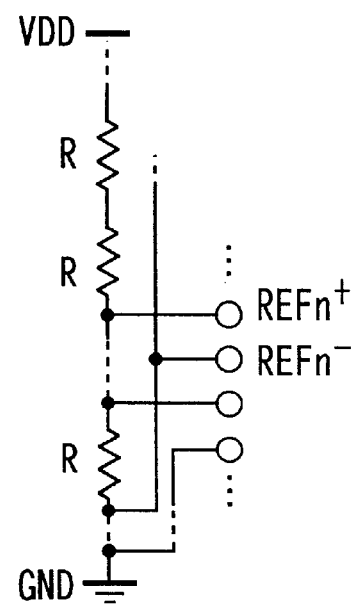
FIG. 11A  FIG. 11B
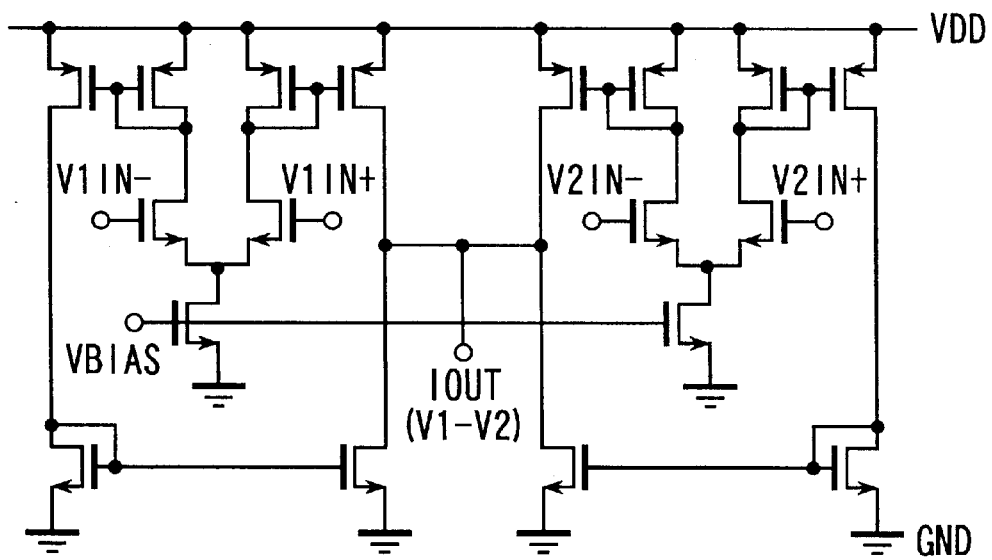
FIG. 12

ANALOG/DIGITAL CONVERTER APPARATUS

BACKGROUND OF THE INVENTION

1. Filed of the Invention

The present invention relates to an analog/digital (A/D) converter apparatus and, more particularly, to an analog/digital converter apparatus having a high-precision A/D conversion function which is performed in consideration of an influence of device mismatch caused by manufacturing a semiconductor integrated circuit.

2. Discussion of the Background

The advance of manufacturing technology of semiconductor integrated circuits has enabled a high-speed processor to be manufactured inexpensively. Such a processor has recently been incorporated into household electrical appliances and communications equipment to process a number of signals in digital form. It is thought that digital signal processing will be advanced from now on and its share will be increased even in the field of communications system. To achieve sophisticated signal processing, a processing apparatus has to be operated with high precision as well as at high speed. In systems of such a field, an analog signal is used to receive a signal or to interface with the outside. A low-cost, high-speed and high-precision analog/digital converter apparatus is therefore required in order to spread digital signal processing more and more in the future.

A representative example of an analog/digital converter apparatus is a flash type analog/digital converter apparatus for comparing the level of an input analog signal with that of a reference signal and converting it into a digital signal. This type of converter apparatus executes simple processing of comparing an input signal with plural reference signals at once and is therefore suited to an application area requiring high-speed processing. Factors for determining conversion precision of the flash type analog/digital converter apparatus are equivalent input offset of a comparator section for determining a relationship in voltage level between an input analog signal and a reference signal and resolution of a reference voltage generator. When an analog/digital converter apparatus is realized in a semiconductor integrated circuit, both the factors of equivalent input offset and resolution are due to device mismatch caused by manufacturing the semiconductor integrated circuit. Since, at this point in time, the equivalent input offset is more remarkable as a factor for determining the above conversion precision than mismatch of elements constituting the reference voltage generator, the conversion precision depends upon the equivalent input offset.

A prior art analog/digital converter apparatus adopts a method of relaxing an influence of equivalent input offset of a comparator. In this apparatus, for example, an analog input voltage and a reference voltage are not compared directly, but an output of a differential amplifier receiving both a reference voltage and an analog input voltage is added to outputs of a plurality of differential amplifiers adjacent thereto and a result of this addition is compared with the above output of the differential amplifier (disclosed in Kaneko et al., "A/D CONVERTER," Jpn. Pat. Appln. KOKAI Publication No. 6-350452). The equivalent input offset can thus be averaged by the number of added outputs of the differential amplifiers.

In the above method, however, the number of outputs used for averaging the equivalent input offset is two or three and thus an influence of device mismatch still remains.

Furthermore, an adder circuit with considerable precision is needed to add output signals of the plural differential amplifiers, as is time required for processing them. In other words, it is understood that a great improvement in conversion precision cannot be expected though additional processing is given to a system for processing a plurality of signals at once.

Even though a problem of equivalent input offset of comparators is resolved, precision is still restricted by mismatch of elements constituting a reference voltage generator.

Therefore, unless the problems of both equivalent input offset and device mismatch are overcome fundamentally, a high-precision analog/digital converter apparatus is very difficult to achieve.

If, as described above, an analog/digital converter apparatus is constituted of a semiconductor integrated circuit, it causes a problem of device mismatch and it is difficult to achieve at low cost and with high conversion precision.

SUMMARY OF THE INVENTION

An object of the present invention is to provide an analog/digital converter apparatus which resolves problems of both equivalent input offset of comparators caused by device mismatch and mismatch of elements constituting a reference voltage generator, and which decreases in costs and increases in precision.

According to a first aspect of the present invention, there is provided an analog/digital converter apparatus comprising a reference signal generator section which generates a reference signal, a comparator section which determines a relationship in level between an input analog signal and the reference signal, and an encoder which converts a comparison result of the comparator into a digital signal. The comparator section includes a comparator which compares the input analog signal with the reference signal and a signal switching section which switches a signal line between the comparator and each of an input section which receives the analog signal and the reference signal generator section.

The comparator section further includes a differential amplifier connected to the signal switching section, an analog signal holding section which holds an analog signal output from the differential amplifier, a sign inverter section which inverts a sign of the analog signal, and an adder section which adds an inverted analog signal and the analog signal output from the differential amplifier and supplies an addition result to the comparator.

According to a second aspect of the present invention, there is provided an analog/digital converter apparatus comprising a reference signal generator section constituted by arranging a plurality of reference elements, for generating a reference signal, a switching section which switches a pattern of connection of the reference elements to a plurality of output lines, a comparator section which determines a relationship in level between an input analog signal and the reference signal, and an encoder which converts a comparison result of each of the comparator sections into a digital signal.

According to a third aspect of the present invention, there is provided an analog/digital converter apparatus comprising a reference signal generator section which generates a reference signal, a comparator section which determines a relationship in level between an input analog signal and the reference signal, and an encoder which converts a comparison result of the comparator section into a digital signal. The reference signal generator section includes a plurality of reference elements constituted of passive elements or active elements, a group of switching elements arranged in matrix, and a switching section which switches a connection pattern of the switching elements. The comparator section includes a comparator which determines a relationship in level between the input analog signal and the reference signal and an averaging unit succeeding the comparator, for averaging a plurality of compared signals generated by switching the connection pattern of the reference elements.

According to a fourth aspect of the present invention, there is provided an analog/digital converter apparatus comprising a reference signal generator section including a plurality of reference elements constituted of passive elements or active elements and a group of switching elements connected to the reference elements and arranged in matrix, the reference signal generator section generating a reference signal, a comparator section which determines a relationship in level between an input analog signal and the reference signal, an encoder which converts a comparison result of the comparator section into a digital signal, and an averaging section including a switching section which switches a connection pattern of the switching elements and provided on an output side of the encoder, the averaging section averaging a plurality of signals output from the encoder by switching a connection pattern of the reference elements.

According to a fifth aspect of the present invention, there is provided an analog/digital converter apparatus comprising a reference signal generator section which generates a reference signal, a comparator section each of which determines a relationship in level between an input analog signal and the reference signal, and an encoder which converts a comparison result of the comparator section into a digital signal, one or both of the input analog signal and the reference signal being processed as a differential signal.

According to a sixth aspect of the present invention, there is provided an analog/digital converter apparatus comprising a reference signal generator section constituted of a plurality of reference signal generator circuits which generates a reference signal, a signal comparator section which compares an input analog signal and the reference signal and outputs a comparison result, an encoder section which converts the comparison result into a digital signal, a selecting section which selects one of the plurality of reference signal generator circuits which is connected to the signal comparator section, and a control section which controls the selecting section.

According to a seventh aspect of the present invention, there is provided an analog/digital converter apparatus comprising a level comparator section which determines whether each of consecutive input levels is higher or lower than a predetermined threshold level and outputs a plurality of determination results, a determination section which determines discrete values of the consecutive input levels from the determination results output from the level comparator section, and a calculation section which calculates one of a total number of comparison results corresponding to a level which is higher than the threshold level and a total number of comparison results corresponding to a level which is lower than the threshold level, the determination section determining the discrete values based on a value calculated by the calculation section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11A and 11B are circuit diagrams of a differentiated reference voltage generator used in the analog/digital converter apparatus shown in FIG. 10;

FIG. 12 is a circuit diagram of a differential amplifier of the differentiated reference voltage generator used in the analog/digital converter apparatus shown in FIG. 10;

DETAILED DESCRIPTION OF THE PREFERRED EMBODIMENTS

Figure 1:
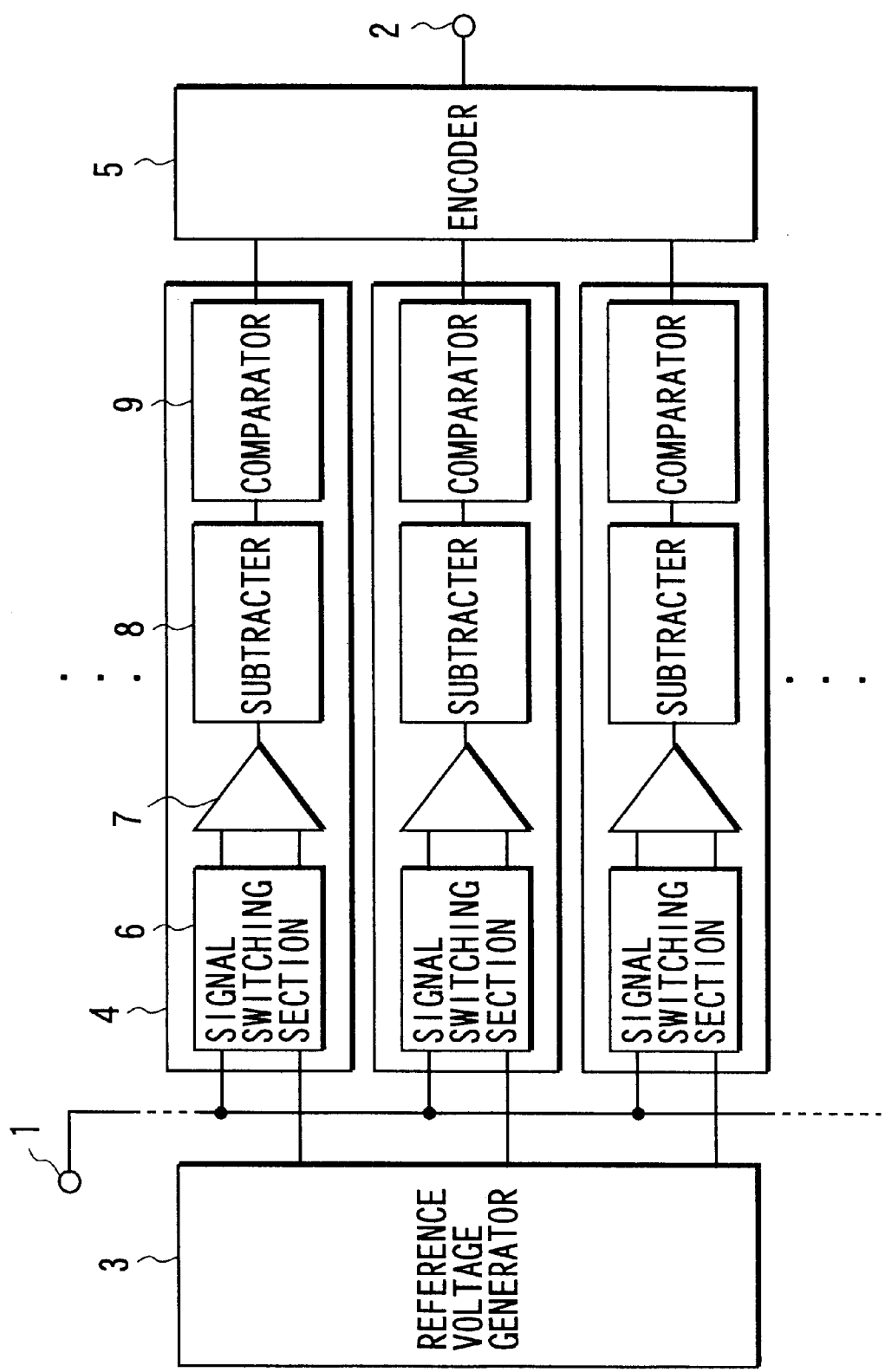
FIG. 1 is a circuit diagram illustrating a basic configuration of a flash type analog/digital converter apparatus according to a first embodiment of the present invention.

Referring now to the drawings, wherein like reference numerals designate identical or corresponding parts throughout the several views, and more particularly to FIGS. 1–28 thereof, there are illustrated various exemplary embodiments of the present invention, as will now be described in detail.

A first embodiment of the present invention aims at avoiding an influence of equivalent input offset of comparators of a flash-type analog/digital converter apparatus. The basic configuration of the analog/digital converter apparatus will be described with reference to FIG. 1.

Referring to FIG. 1, the analog/digital converter apparatus includes an analog signal input terminal 1, a digital signal output terminal 2, a reference voltage generator 3, comparator sections 4, and an encoder 5. The comparator sections 4 each include a signal switching section 6, a differential amplifier 7, a subtracter 8 and a comparator 9. Each of the comparator sections 4 compares the level of a voltage input from the analog signal input terminal 1 and that of each of reference voltages output from the reference voltage generator 3 and then outputs a comparison result. In other words, each comparator section 4 determines which reference voltage is higher or lower than the level of an input analog signal. The encoder 5 converts the determination result into a digital signal and outputs it from the digital signal output terminal 2.

Equivalent input offset, which is due to device mismatch caused by manufacturing a semiconductor integrated circuit, is added to the comparator sections 4. If, for example, equivalent input offset On is added to the 1st comparator section 4, a sign of the next output value An will be checked as follows in the n-th comparator section 4.

$$An^+ = a_n(vin + On - REFn) \quad (1)$$

where n indicates the n-th signal system, $a_n$ represents the gain of the differential amplifier, On shows the equivalent input offset added to the first input terminal, and REFn denotes the level of a reference signal. If a signal input to each comparator section 4 is inverted, its output value An is expressed as follows.

$$An^- = a_n(REFn + On - Vin) \quad (2)$$

Subtracting equation (2) from equation (1), a value Bn to be compared is given by the following equation.

$$Bn = An^+ - An^- = 2a_n(Vin - REFn) \quad (3)$$

The equivalent input offset is thus canceled out. If, therefore, the above processing is executed in the comparator sections 4, an influence of equivalent input offset can be avoided. Since a sign of output value An is checked, variations in gain $a_n$ of the differential amplifier present no problem.

Figure 2:
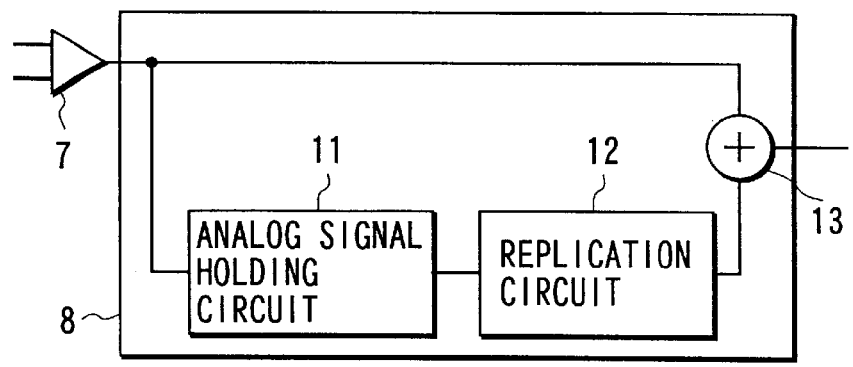
FIG. 2 is a block diagram of a subtraction section of the analog/digital converter apparatus shown in FIG. 1.

For the above processing, each of the comparator sections 4, shown in FIG. 1, includes the signal switching section 6 for switching an input signal and a reference voltage signal, differential amplifier 7, subtracter 8 for subtracting an output of the differential amplifier 7, and comparator 9 for comparing a result of the subtraction with the reference value. Further, as illustrated in FIG. 2, the subtracter 8 includes an analog signal holding circuit 11 for holding an analog signal output from the differential amplifier 7, a replication circuit 12 for inverting a sign of the analog signal and replicating the analog signal, and an adder 13 for adding the inverted analog signal and the output analog signal of the differential amplifier 7. The analog signal holding circuit 11 and replication circuit 12 can be replaced with each other. The adder 13 may be formed by simply connecting an output line of the differential amplifier 7 to that of the replication amplifier 12.

Figure 3:
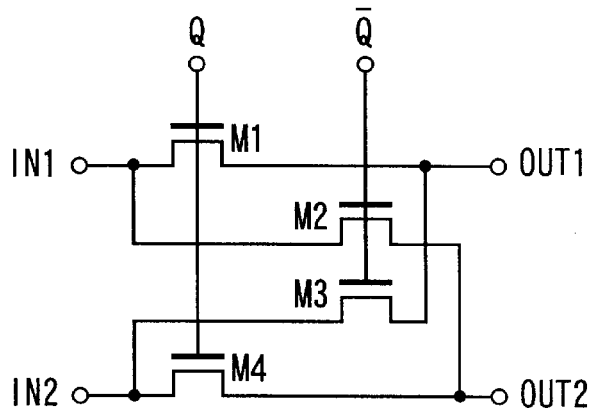
FIG. 3 is a circuit diagram of a signal switching section of the analog/digital converter apparatus shown in FIG. 1.

As shown in FIG. 3, the signal switching section 6 may be constructed by a switching circuit for switching transistors. More specifically, an input terminal In1 of the switching circuit 6 is connected to output terminals Out1 and Out2 through MOS transistors M1 and M2, respectively, while an input terminal In2 thereof is connected to the output terminals Out1 and Out2 through MOS transistors M3 and M4, respectively. In the switching circuit 6 so arranged, two signal lines, i.e., first signal lines In1-Out1 and In2-Out2 and second signal lines In1-Out2 and In2-Out1 can be replaced with each other by inverting switch control signals Q and $\overline{Q}$. $\overline{Q}$ represents an inverted signal.

Figures 4, 5:
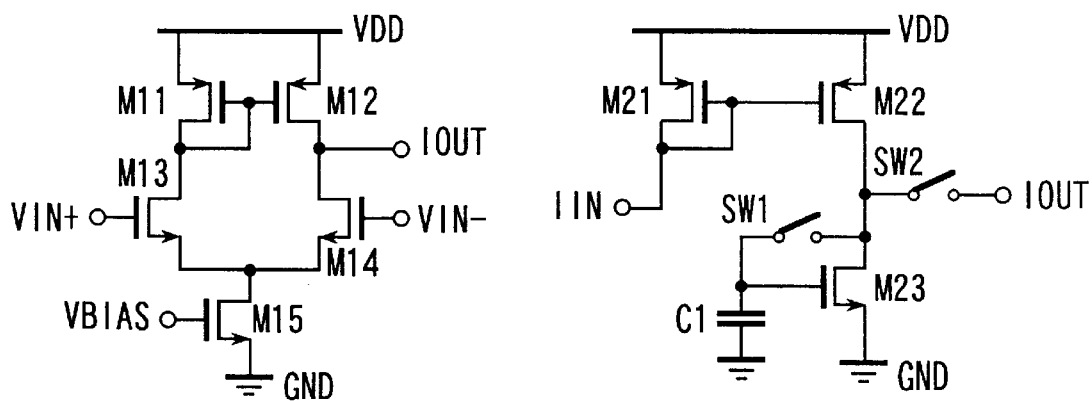
FIG. 4 is a circuit diagram of a differential amplifier of the analog/digital converter apparatus shown in FIG. 1.
FIG. 5 is a circuit diagram of a subtraction section of the analog/digital converter apparatus shown in FIG. 1.

As illustrated in FIG. 4, the differential amplifier 7 can be formed of a representative circuit in which the source ends of MOS transistors are connected in common. More specifically, the differential amplifier 7 includes a current mirror circuit constituted of MOS transistors M11 and M12, an input circuit constituted of MOS transistors M13 and M14, and a constant-current source constituted of a MOS transistor M15. The differential amplifier 7 outputs a current the level of which is proportional to a difference between input voltages Vin+ and Vin−, from an output terminal Iout thereof.

The subtracter 8, as shown in FIG. 5, may be constructed using a sample hold circuit of a current mode. In other words, the subtracter 8 includes a current mirror circuit constituted of MOS transistors M21 and M22 and a sample hold circuit constituted of a MOS transistor M23 and a capacitor C21. In this subtracter 8, when a first switch SW1 is turned on and a second switch SW2 is turned off, an output current of the differential amplifier 7 operated in the first mode corresponding to above equation (1), is held in the sample hold circuit. The first switch SW1, transistor M23 and capacitor C1 constitute the foregoing analog signal holding circuit 11.

On the other hand, when the first switch SW1 is turned off and the second switch SW2 is turned on, the subtracter 8 performs a subtraction between an output current of the differential amplifier 7 operated in the second mode corresponding to above equation (2) and that of the differential amplifier 7 operated in the first mode, which is held in the sample hold circuit, and outputs a result of the subtraction.

An operation of the analog/digital converter apparatus illustrated in FIG. 1 will now be described.

An input signal is supplied to one terminal of each of the plural comparator sections 4 from the input terminal 1, and a plurality of reference voltages are generated from the reference voltage generator 3 and each applied to the other terminal of the comparator section 4. In the first mode, the MOS transistors M1 and M4 of the signal switching section 6 of each comparator section 4 are turned on, and the MOS transistors M2 and M3 thereof are turned off, and the input signal and reference voltage are input to the differential amplifier 7. The output of the differential amplifier 7 is then held in the sample hold circuit of the subtracter 8.

In the second mode, the control signals Q and $\overline{Q}$ are switched in the signal switching section 6, the MOS transistors M1 and M4 are turned off, and the MOS transistors M2 and M3 and turned on. The input signal and reference voltage are transposed to each other and input to the differential amplifier 7. A subtraction is then performed between the output of the differential amplifier 7 and the signal held in the sample hold circuit. Thus, a signal whose offset component is canceled is output from the subtracter 8 and supplied to the comparator 9. The comparator 9 compares the output signal of the subtracter 8 with the reference signal and supplies a comparison result to the encoder 5.

As described above, in the comparator section 4, the output currents of the differential amplifier 7 operated in the two modes are processed by the same subtracter 8, so that a mismatch of signals due to device mismatch caused by manufacturing a semiconductor integrated circuit, does not occur in this section. Since, furthermore, the output currents are processed in the current mode, complicated circuits for sign inversion and addition are not required.

Bringing the present invention into practice necessitates a processing time for inverting and averaging an input analog signal and a reference signal. Now let us consider a relationship between processing speed and conversion precision. Since manufacturing technology of semiconductor integrated circuits is remarkably advanced, it is expected that miniaturization and packing density of devices will be increased in the future. If the devices are reduced in size, the circuits can be operated at higher speed even by the same current consumption. However, as the devices decrease in size, an influence of device mismatch becomes greater. The technique of the present invention for improving the conversion precision at a desired processing speed is therefore advantageous. To achieve a high-precision converter apparatus using small devices as they are, meets a requirement for suppressing power consumption of integrated circuits, which will be increased as the devices are improved in miniaturization and packing density.

The processing for inverting the signal lines of an input analog signal and a reference signal and the processing for subtracting an output of the differential amplifier in two modes, both of which are needed for the present invention, can be executed at once within a time period of one clock signal. It is therefore understood that an advantage of high precision for the processing time in the present invention is greater than that in the prior art. It is also understood that an additional circuit required for the above processing is smaller than that of the prior art and thus advantageous in achieving a low-cost analog/digital converter apparatus.

An analog/digital converter apparatus according to a second embodiment of the present invention, which improves a method of generating a reference signal, will now be described. The second embodiment aims at averaging device mismatches between elements constituting a reference voltage generator by arbitrarily changing an arrangement of the elements.

Figure 6:
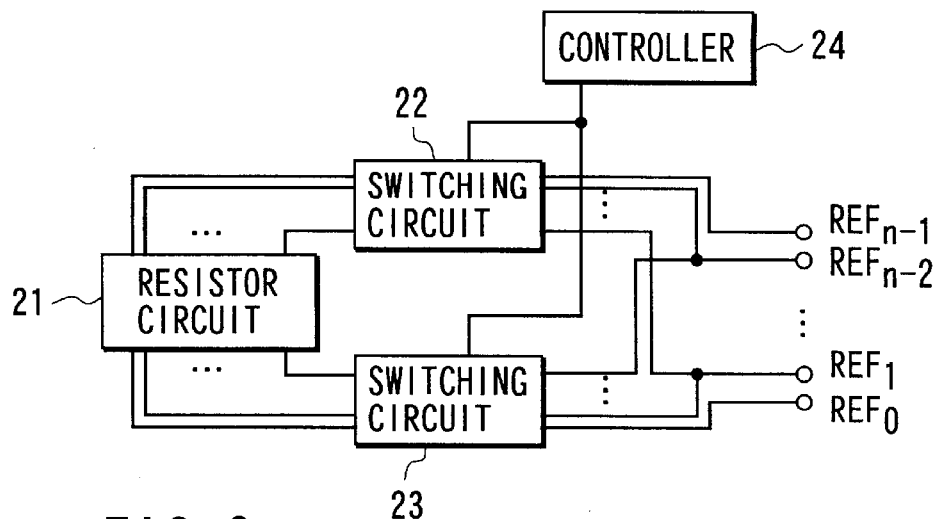
FIG. 6 is a block diagram of a reference voltage generator of an analog/digital converter apparatus according to a second embodiment of the present invention.
Figure 7:
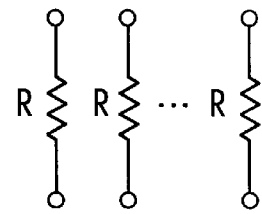
FIG. 7 is a view of a resistor element group of the reference voltage generator shown in FIG. 6.
Figure 8:
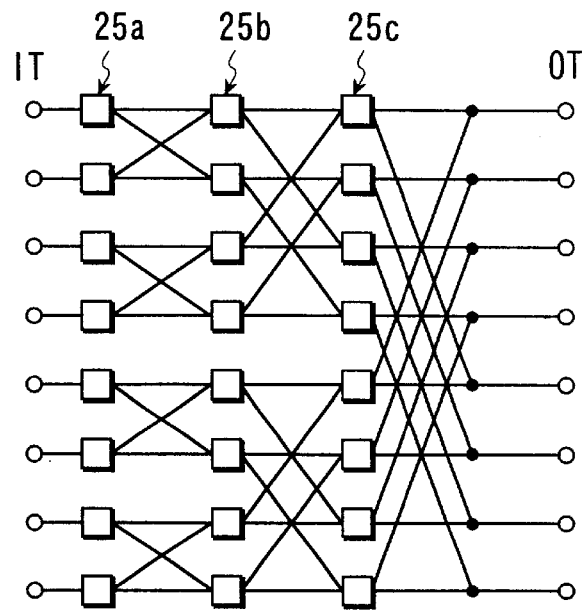
FIG. 8 is a diagram of a switching element group of the reference voltage generator shown in FIG. 6.

According to the second embodiment, as shown in FIG. 6, a reference voltage generator 3 is so constituted that an arrangement of resistors constituting the generator 3 can be changed properly. The reference voltage generator 3 includes a resistor circuit 21, a first switching circuit 22, a second switching circuit 23 and a controller 24. As illustrated in FIG. 7, the resistor circuit 21 includes a plurality of passive elements, such as a plurality of resistors R having the same resistance, and both ends of each resistor are guided to their respective terminals. The first and second switching circuits 22 and 23, as shown in FIG. 8, are each constituted of switch groups 25a to 25c by which lines from n input terminals IT to n output terminals OT are arbitrarily switched. In other words, each of the switching circuits 22 and 23 includes first, second and third switch groups 25a, 25b and 25c. The output terminal of each of adjacent two switches of the first switch group 25a is connected to the input terminals of adjacent two switches of the second switch group 25b. The output terminal pairs of the adjacent two switch pairs of the second switch group 25b are connected to the input terminal pairs of the adjacent two switch pairs of the third switch group 25c in such a manner that the connection lines from the output terminals of one of adjacent two pairs of switches of the second switch group 25b cross those of the other one of adjacent two pairs of switches. The output terminals of the switches of the third switch group 25c are connected to the output terminals OT in such a manner that the connection lines from the output terminals of two sets of switches (each set having four switches) cross those of the other set of switches.

Figures 9, 10:
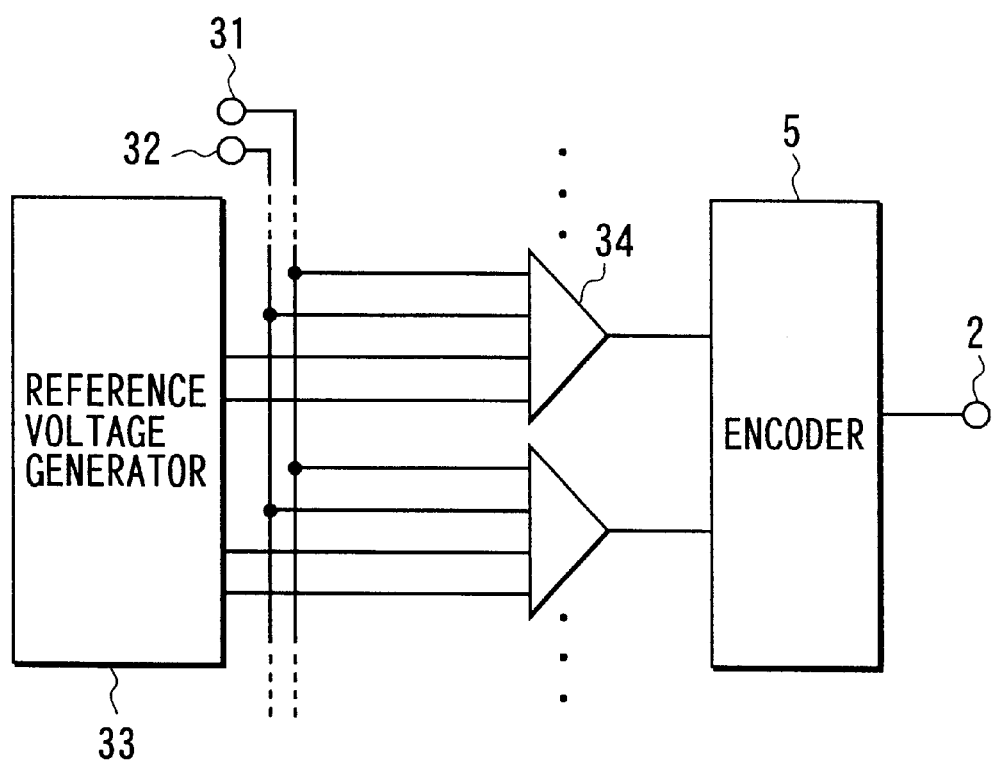
FIG. 9 is a table showing a relationship between inputs and outputs for operating the switching element group illustrated in FIG. 8.
FIG. 10 is a block diagram illustrating a basic configuration of a flash type analog/digital converter apparatus according to a third embodiment of the present invention, in which respective signals are differentiated.

The switching circuits 22 and 23 perform their switching operations upon receiving from the controller 24 signals which are coded so as to satisfy the connecting conditions shown in FIG. 9.

According to the connecting conditions, one terminal connected to the n-th resistor of a resistive element group, is connected to the $(X_n-1)$-th terminal via the first switching circuit 22, and the other terminal is connected to the $(X_{n-1}-1)$-th terminal via the second switching circuit 23. FIG. 8 shows an example of a circuit having eight inputs and eight outputs. Even though the inputs and outputs are increased in number, the same circuit can be achieved.

Since the connections of the resistors can freely be varied as described above, the outputs of the plural comparators can be averaged. Thus, an influence of mismatch of elements constituting the reference voltage generator is lessened further.

If resistors for the reference voltage generator are prepared more than required and a necessary number of resistors are chosen therefrom, an averaging effect of lessening an influence of fixed errors is produced more greatly.

The above description is based on an example of the reference voltage generator using resistive elements. However, the reference voltage generator can be constituted of capacitors as passive elements or current sources as active elements.

A flash type analog/digital converter apparatus according to a third embodiment of the present invention will now be described. The third embodiment aims at referring to a reference voltage between any two nodes of a reference voltage generator by differentiating signals.

FIG. 10 illustrates a basic configuration of the flash type analog/digital converter apparatus in which an input analog signal and a reference signal are differentiated. More specifically, this apparatus includes input terminals 31 and 32 for receiving the differentiated analog signals, a reference voltage generator 33 for generating a reference signal (reference voltage) by differentiation, differential amplifiers 34 having differential input terminals of two channels, an encoder 5, and a digital signal output terminal 2.

FIG. 11A illustrates a reference voltage generator for generating a voltage which differs in level from a reference voltage, while FIG. 11B shows a modification to the reference voltage generator of FIG. 11A, which has no reference potentials in common. These reference voltage generators can be used as the reference voltage generator 33 shown in FIG. 10.

The reference voltages are generated by extracting a potential between any two nodes of resistors by differentiating a signal. A great variety of reference voltages can thus be generated by the arrangement of resistors, and the foregoing averaging operation can be performed with higher precision.

The differential amplifier 34 can be achieved by an adder which is constituted by connecting two pairs of current output differential amplifiers shown in FIG. 12. In this adder, a current output terminal Iout outputs a current the amount of which is in proportion to a difference between first and second potential differences V1 and V2.

Since, in the flash type analog/digital converter apparatus of the present invention, an input analog voltage and reference voltages can be processed in a differential mode, higher-precision signals can be processed.

It is concerned that a high-speed operation of a digital circuit will cause noise, which propagates a power supply line, a ground and a substrate, to leak into signals processed by an analog circuit. However, a tolerance against such a noise can be improved by differentiating the signals. Furthermore, power supplies and grounds of the analog and digital circuits are generally constituted by different systems in order to overcome a problem of the noise. If, however, the signals are differentiated and processed, a difference in power supply and ground level between an analog/digital converter and a sensor, need not be considered.

Figure 13A:
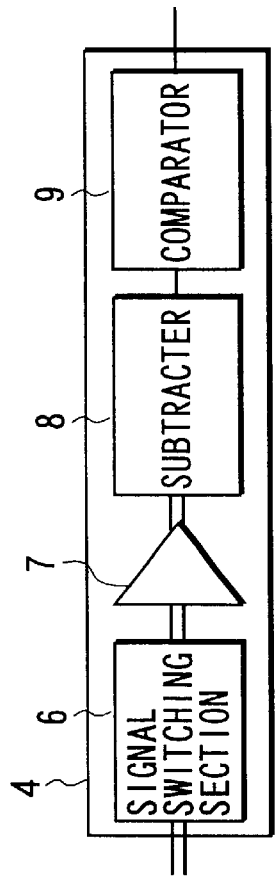
FIGS. 13A and 13B are block diagrams of a comparator section used in an analog/digital converter apparatus according to a fourth embodiment of the present invention.
Figure 13B:
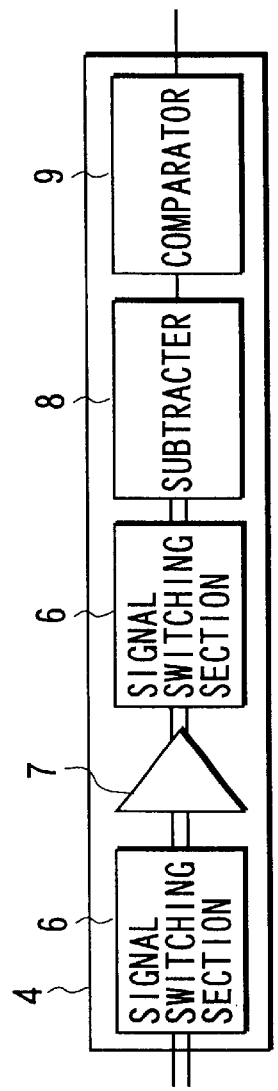

An analog/digital converter apparatus according to a fourth embodiment of the present invention will now be described. FIGS. 13A and 13B illustrate comparator sections 4 of the converter apparatus. Each of the comparator sections 4 is so constituted that an output signal of a differential amplifier 7 is processed as a differential signal. Like in the first embodiment shown in FIG. 1, the comparator sections 4 each includes a signal switching section 6, a differential amplifier 7, a subtracter 8 and a comparator 9. In the comparator section shown in FIG. 13A, the subtracter 8 performs a subtraction of differentiated signals. In the comparator section shown in FIG. 13B, since an output signal of the differential amplifier 7 is switched again by the signal switching section 6, the subtracter 8 can be constructed by only an analog signal holding section and an adder section and accordingly the construction of hardware can be simplified on the whole.

Figure 14:
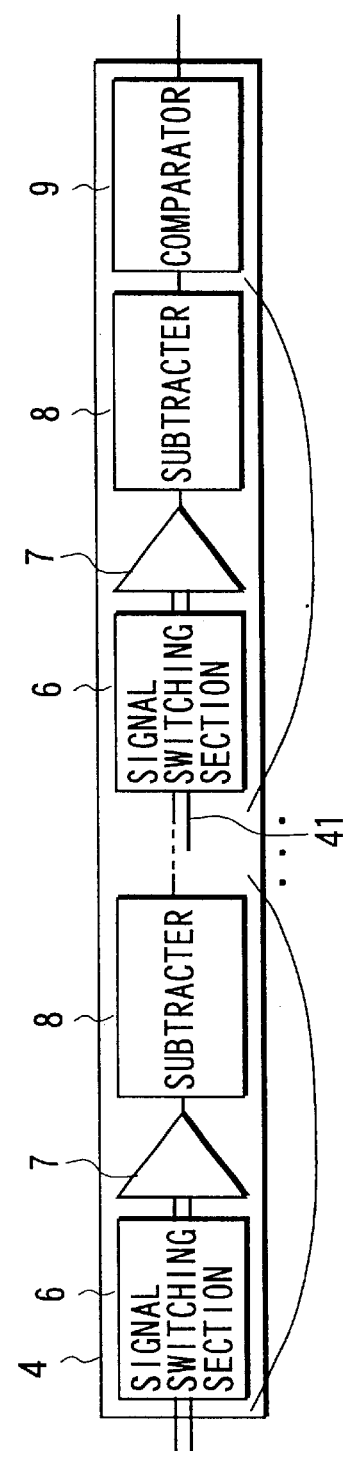
FIG. 14 is a block diagram of a comparator section including a plurality of offset cancels arranged one on another, which is provided in an analog/digital converter apparatus according to a fifth embodiment of the present invention.

FIG. 14 illustrates a comparator section of an analog/digital converter apparatus according to a fifth embodiment of the present invention. In this comparator section, a plurality of offset cancellation circuits for canceling equivalent input offsets, are continuously arranged. This arrangement reduces an influence of offsets of the comparator section further. Each of the offset cancellation circuits corresponds to the comparator section of the first embodiment and includes a signal switching section 6, a differential amplifier 7, a subtracter 8 and a comparator 9. A terminal 41 is a reference signal input terminal for determining a sign in the comparator 9.

Figure 15:
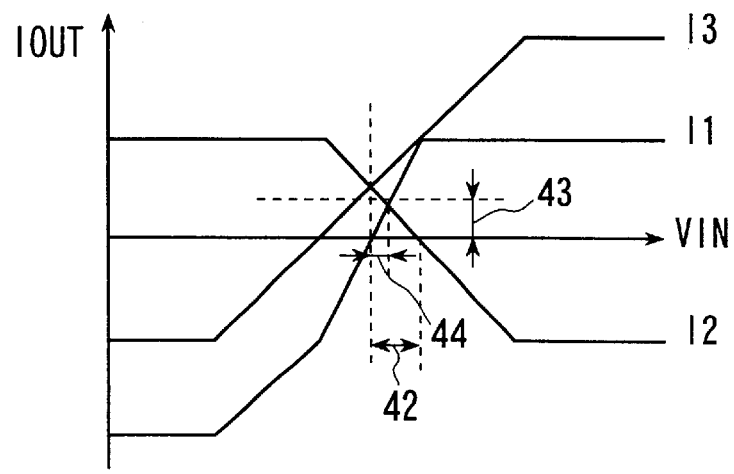
FIG. 15 is a view for explaining an advantage of the offset cancels.

The advantage of the fifth embodiment will now be described with reference to FIG. 15. In FIG. 15, $I_1$ and $I_2$ denote outputs of the differential amplifier which are expressed by the following equations (4) and (5), respectively.

$$I_1 = a_n(\text{vin} + \text{On} - \text{REFn}) \quad (4)$$

$$I_2 = a_n(\text{REFn} + \text{On} - \text{Vin}) \quad (5)$$

Furthermore, in FIG. 15, $I_3$ indicates a difference between the above two signals as represented by the following equation (6).

$$I_3 = I_1 - I_2 = 2a_n(\text{Vin} - \text{REFn}) \quad (6)$$

It is seen from the above that equivalent input offset 42 of the differential amplifier is canceled out by averaging two signals. Since the converter apparatus of the fifth embodiment is constituted of a semiconductor integrated circuit, the comparator for determining a sign of the averaged signals is also inevitably influenced by the equivalent input offset. Assuming that the equivalent input offset 43 of the comparator has a level shown in FIG. 15, it is converted into a value 44, which corresponds to an input of the comparator section 4, by the offset cancellation technique of the present invention. In the above equations, $a_n$ represents a gain of the differential amplifier.

It is understood from the above that if two offset cancellation circuits are arranged, the advantage of offset cancellation becomes a fraction of a gain of the differential amplifier of one of the offset cancellation circuits.

Figure 16:
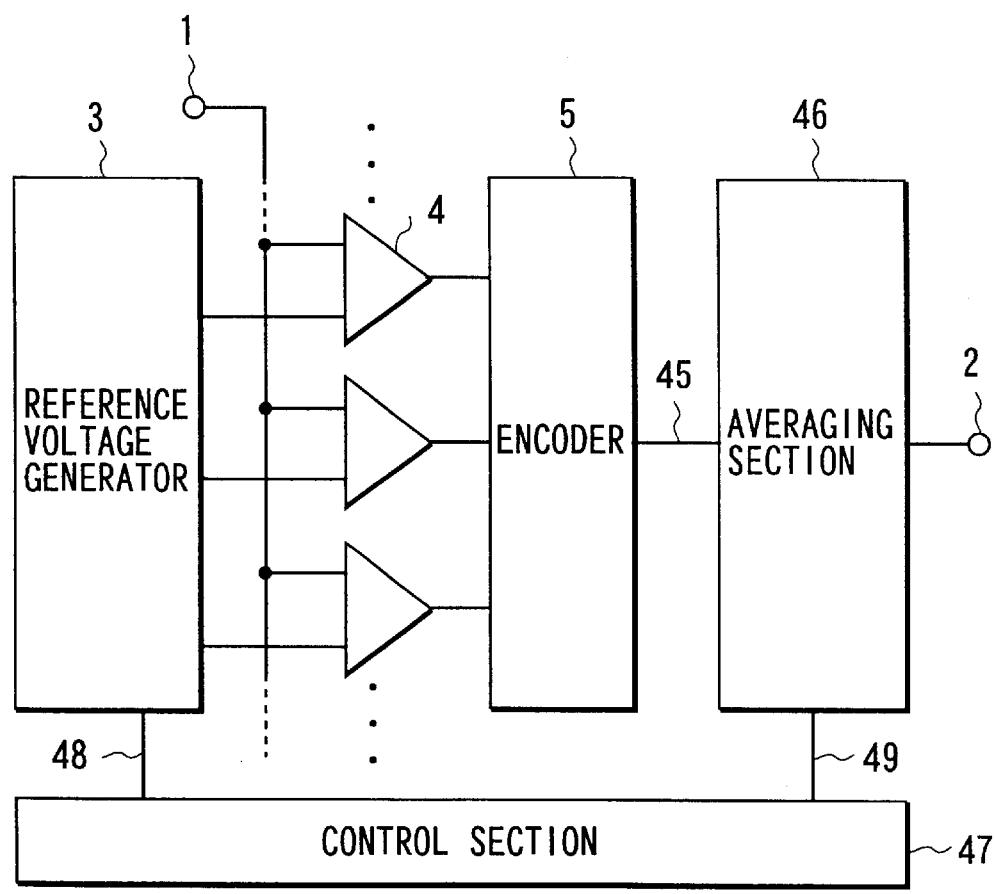
FIG. 16 is a block diagram of an analog/digital converter apparatus according to a sixth embodiment of the present invention.

FIG. 16 illustrates an analog/digital converter apparatus according to a sixth embodiment of the present invention. In this embodiment, too, the apparatus includes an analog signal input terminal 1, a digital signal output terminal 2, a reference voltage generator 3, comparator sections 4, and an encoder 5. It also includes an averaging section 46 and a control section 47. The encoder 5 outputs an encoder signal 45, while the control section 47 outputs control signals 48 and 49.

Using a technique of reducing an influence of device mismatch by averaging a plurality of reference signals set for one input analog signal when the arrangement of resistors constituting the reference voltage generator is changed, encoder signals 45 can be averaged digitally as shown in FIG. 16, and a problem of precision can be ignored.

Figure 17:
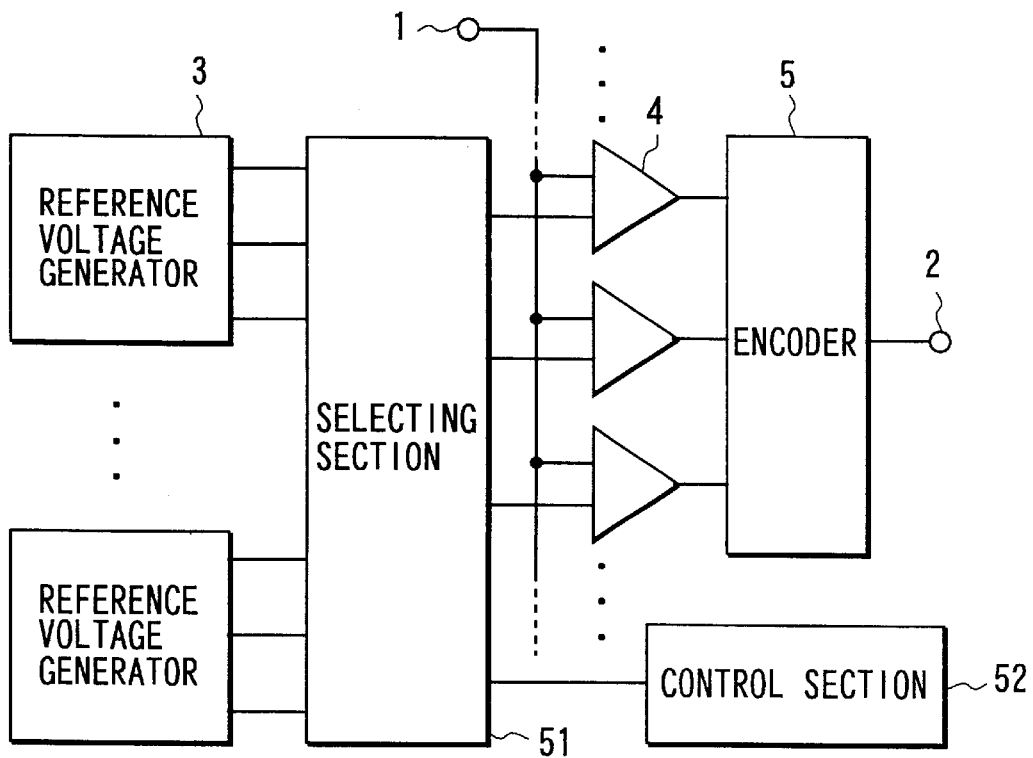
FIG. 17 is a block diagram of an analog/digital converter apparatus according to a seventh embodiment of the present invention.

FIG. 17 illustrates an analog/digital converter apparatus according to a seventh embodiment of the present invention. This apparatus includes an analog signal input terminal 1, a digital signal output terminal 2, comparator sections 4 and an encoder 5, and its basic configuration is the same as that of the apparatus shown in FIG. 1. In the seventh embodiment, however, the apparatus includes a plurality of reference voltage generators 3 (3a, 3b, . . . , 3n), a selecting section 51 for selecting one of the reference voltage generators 3, and a control section 52 for controlling the selection of the reference voltage generators 3.

Figures 18, 19:
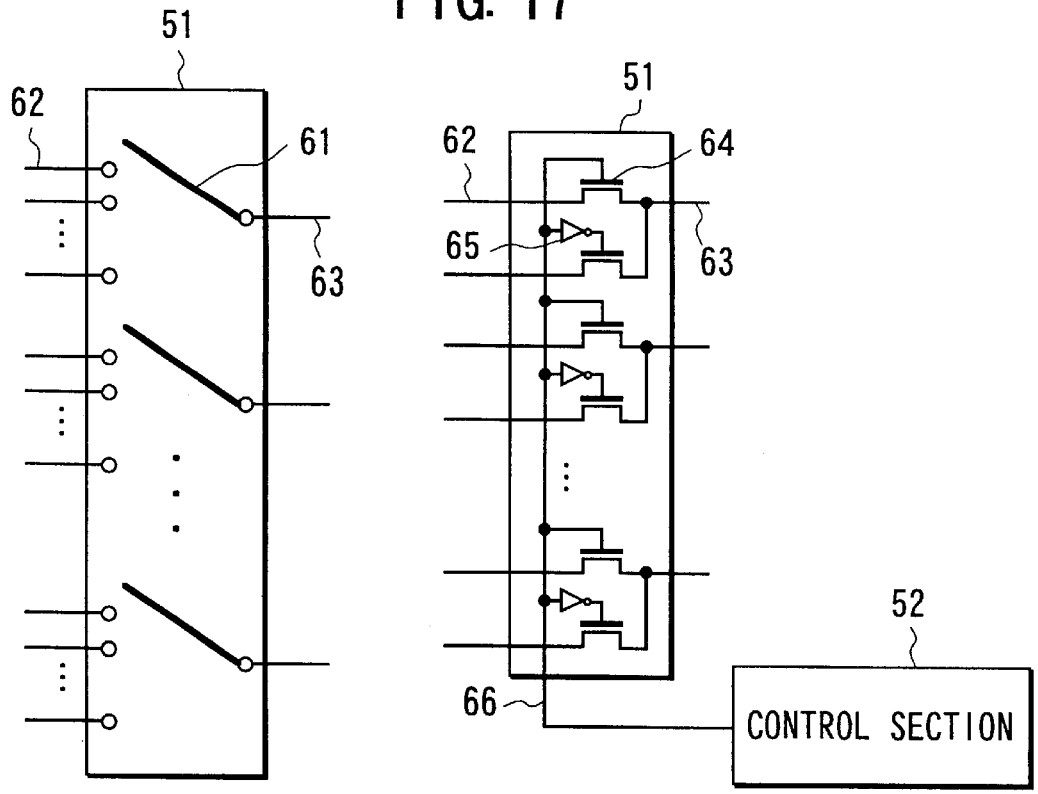
FIG. 18 is a schematic view illustrating a constitution of a selection section of the analog/digital converter apparatus shown in FIG. 17.
FIG. 19 is a block diagram specifically showing a selection section of the analog/digital converter apparatus of FIG. 18.

The selecting section 51 is constituted of a multi-input/single-output switch as illustrated in FIG. 18. The switch 51 includes switches 61 the number of which corresponds to that of levels of the reference voltage generators, and all the switches 61 perform the same operation in response to one control signal. Each of the switches 61 is connected to a corresponding one of output terminals 62 of the reference voltage generators and guided to a corresponding one of reference voltage input terminals 63. The selecting section 51 is constituted of MOS transistors as shown in FIG. 19. When signals are input over two channels, the gate of each of the MOS transistors is connected to a control signal terminal 64 of the control section 52 directly or through an inverter 65. The control section 52 supplies the selecting section 51 with a signal for controlling the switches.

According to the seventh embodiment shown in FIG. 17, a relationship in level between the voltage of an input analog signal and each of the reference voltages is determined by the comparator section 4, and an output signal of the comparator section 4 is converted into a digital signal by the encoder 5 and output from the output terminal 2. An actual reference level consists of an ideal value and an error. The error is regarded as a noise. The element value of each element indicates a value obtained by adding an error to a true value. The error is attributable to a fixed noise. Assume that an analog signal An is input to the input terminal 1, a digital signal Dn corresponding to the input analog signal An is output based on the reference voltage generator 3$a$, and noise NnA is added to the level of the output digital signal Dn. Also, assume that a signal having the same level as that of the input analog signal An is input, a digital signal Dn is output using the reference voltage generator 3$b$, and noise NnB is added to the output digital signal Dn. In this case, NnB NnA. If, in general, there are plural reference voltage generators 3$a$, 3$b$, . . . , 3$n$, noise levels on the reference signals of the same level have different values.

Figure 20:
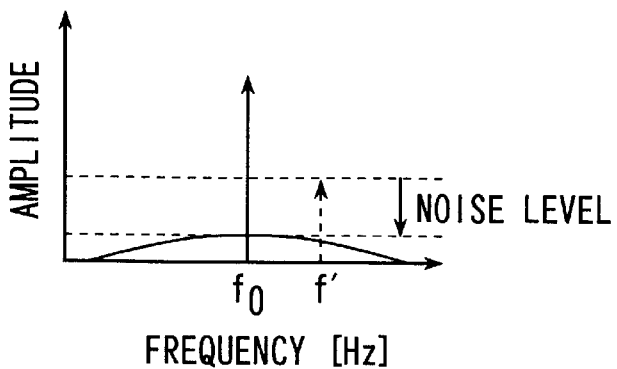
FIG. 20 is a graph showing an advantage of the analog/digital converter apparatus of FIG. 17.

If noise levels on signals having the same level are varied, a tone is broadened by noise having a fixed frequency, as shown in FIG. 20. Consequently, problems in the application areas of communications can be resolved.

As one method of controlling the selecting section 51, reference voltage generators in use are replaced one by one. This will make the constitution of the control section 52 more simple.

As another method, a random signal is generated to control the selecting section 51. This method is effective in periodically receiving input signals.

Figure 21:
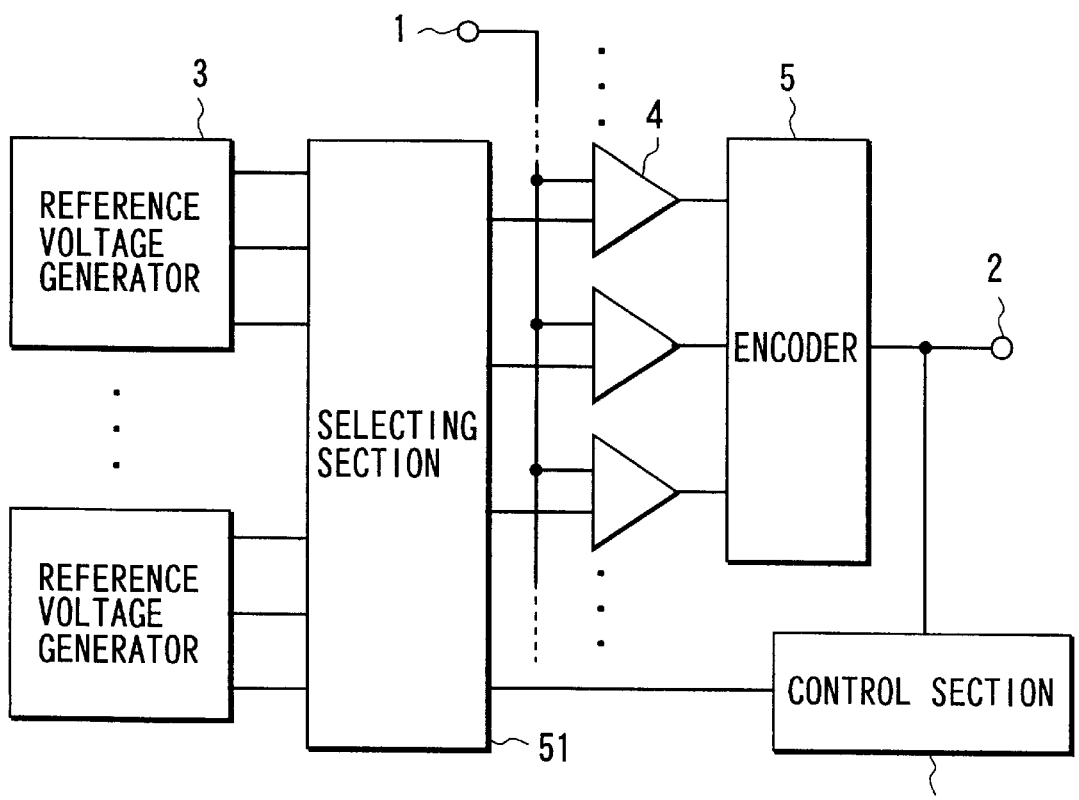
FIG. 21 is a block diagram illustrating an analog/digital converter apparatus according to an eighth embodiment of the present invention.

FIG. 21 illustrates a flash type analog/digital converter apparatus according to an eighth embodiment of the present invention. The basic configuration of the apparatus in the eighth embodiment is the same as that in the seventh embodiment. A control section 53 for controlling selection of reference voltage generators 3 produces a control signal with reference to an output digital signal. The control section 53 includes a storage unit for storing history information on the used reference voltage generators 3. It is thus possible to suppress the same noise added to the level of a specific input signal further. In the eighth embodiment, the storage unit is constituted of memories arranged in matrix of m×l (m=the number of reference voltage generators, l=the number of levels of the analog/digital converter apparatus).

Referring to the output digital signal, the control section 53 selects a reference voltage generator which was not used when the digital signal was output and then generates a control signal. It is effective in constituting the control section 53 so as to produce a control signal avoiding a reference voltage generator used when the digital signal was output or a reference voltage generator used the most when the digital signal was output, with reference to both the output digital signal and a history of the used reference voltage generators.

If it is unnecessary to change a reference voltage generator used with reference to a digital signal output when a new analog signal is input, the output digital signal can be used as it is. The analog/digital converter apparatus can thus be obtained without losing the advantage of high-speed operation.

As described above, the eighth embodiment is directed to the flash type analog/digital converter apparatus. If, however, the apparatus compares an input analog signal and reference voltages, an analog/digital converter apparatus of another type such as a cyclic type may be used. In other words, the apparatus has a plurality of reference voltage generators and, if they are used equally, mismatches between elements constituting the reference voltage generators can be averaged.

According to the foregoing seventh and eighth embodiments, a plurality of reference voltage generators for generating reference voltages to be compared with an input analog signal, are prepared and selectively used in response to a control signal to average errors due to mismatch of elements constituting the reference voltage generators. Consequently, a high-speed, high-conversion-precision analog/digital converter apparatus can be obtained.

The above embodiments show cancellation of an equivalent input offset added to an input analog signal because of mismatch of elements constituting the comparator and reference voltage generators, caused by manufacturing these elements. A value of the equivalent input offset is smaller than that of the above offset due to the device mismatch, but it can be thought that an offset value, which is varied with time by a thermal fluctuation, is added to the comparator, reference voltage generators and the like. These offsets can be considered to be a fluctuation of threshold values determined by the comparators. If, because of this fluctuation, the number of levels of the analog/digital converter apparatus is increased, in other words, a voltage interval between the reference voltage generators is narrowed, a difference due to the fluctuation between threshold values actually determined by the comparators and nominal levels of reference voltages applied thereto, becomes relatively wider than a difference between the reference voltages. In some cases, when the actually-determined threshold values are checked in order of nominal levels of reference voltages applied to the comparators, their monotony will be lost or a reversal phenomenon will appear in the determined threshold values. If an analog signal is input when the reversal phenomenon occurs, an output pattern showing whether the level of the input analog signal is higher or lower than that of each of reference potentials of the comparators, will be disordered. In a technique of finally determining an output digital signal based on a transition between high and low levels, an error occurs in results of determination.

A ninth embodiment is directed to an analog/digital converter apparatus which cancels an offset value due to a thermal fluctuation.

Figure 22:
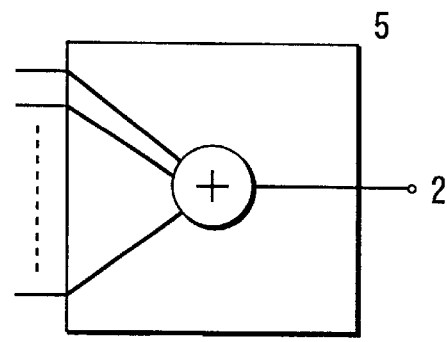
FIG. 22 is a schematic circuit diagram of an encoder used in an analog/digital converter apparatus according to a ninth embodiment of the present invention.

The analog/digital converter apparatus of the ninth embodiment will now be described. This apparatus has substantially the same configuration as that of each of the foregoing embodiments, but an encoder 5 in use is constituted as shown in FIG. 22. The encoder 5 has a function of calculating the total number of comparators which output high-level signals. A result of the calculation is regarded as a discrete value of analog/digital conversion.

Figure 23:
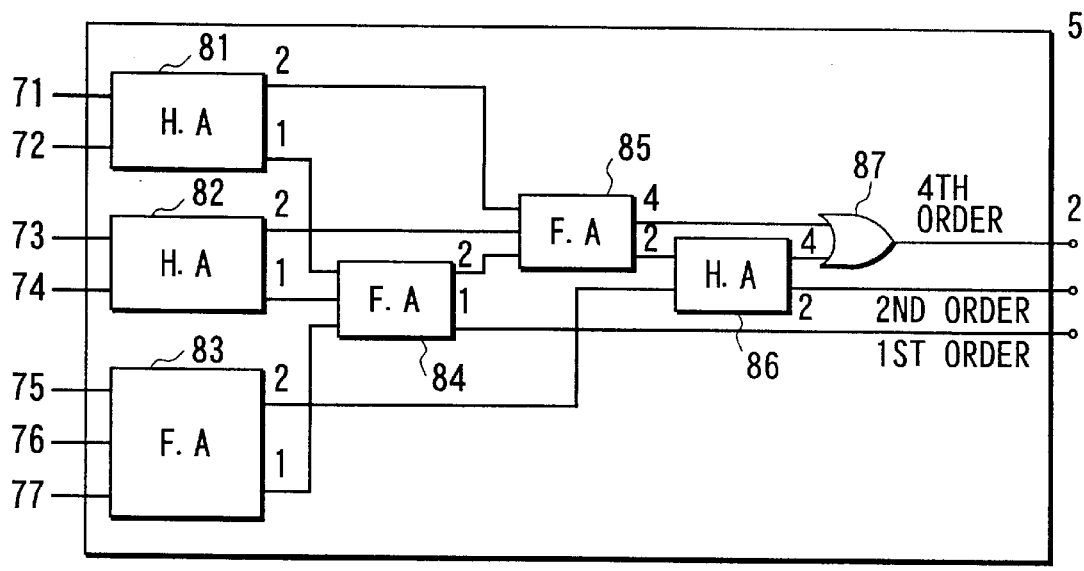
FIG. 23 is a circuit diagram showing the encoder of FIG. 22 more specifically.

FIG. 23 more specifically shows the constitution of the encoder 5 including seven comparators. The encoder 5 includes half adders (H.A) 81, 82 and 86 and full adders (F.A) 83, 84 and 85. Input terminals 71 and 72 are connected to the half adder 81, input terminals 73 and 74 are connected to the half adder 82, and input terminals 75, 76 and 77 are connected to the full adder 83. The first-order output terminals of the half adders 81 and 82 and full adder 83 are connected to the input terminals of the full adder 84, while the second-order output terminals of the half adders 81 and 82 and full adder 84 are connected to the input terminals of the full adder 85. The second-order output terminals of the full adders 83 and 85 are connected to the input terminals of the half adder 86. The fourth-order output terminals of the full adder 85 and half adder 86 are connected to the input terminals of an OR gate 87. The encoder 5 so constituted outputs the first-, second- and fourth-order signals in response to input signals of the input terminals 71 to 77.

Figure 24:
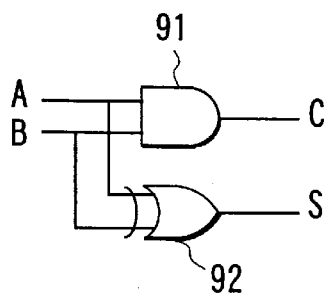
FIG. 24 is a circuit diagram of a half-adder used in the encoder shown in FIG. 23.
Figure 25:
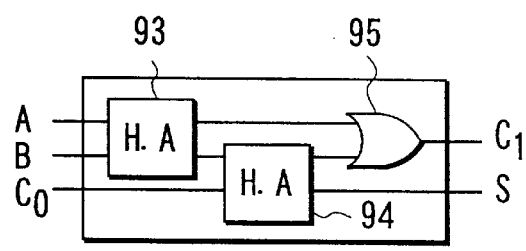
FIG. 25 is a circuit diagram of a full adder used in the encoder shown in FIG. 23.

The half adders H.A and full adders F.A are constituted as illustrated in FIGS. 24 and 25. More specifically, the half adders H.A are each constituted of an AND gate 91 and a NOR gate 92 both connected to input terminals A and B. A relationship between input and output of the half adder H.A is shown in the table of FIG. 26.

The full adders F.A are each constituted of a half adder 93 connected to input terminals A and B, a half adder 94 connected to an input terminal CO and one output terminal of the half adder 93, an OR gate 95 connected to the other output terminal of the half adder 93 and one output terminal of the half adder 94.

In the ninth embodiment, a digital signal output terminal 2 outputs a signal in 3-bit parallel. Therefore, even though a comparison result of the comparator is represented by a decayed pattern such as "LLHLHHHH" because of a fluctuation in threshold values determined by the comparator, which is due to device mismatch caused at the time of the manufacture, the decayed pattern can be regarded equally as "LLLHHHHH." Theoretically this pattern includes four consecutive levels "H" and levels "H" between which a level "L" is inserted. Accordingly, even though the threshold value of the comparator has an offset, there is a strong possibility that the level of the actually input signal is higher than that of a transition from the four consecutive levels "H" to the level "L". In other words, the present embodiment is one of simple methods of the probable estimation of the actual input level from the pattern of a given comparison result.

Figures 26, 27:
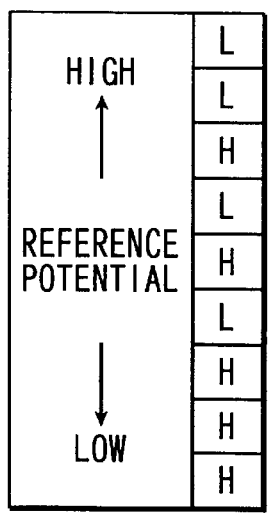
FIG. 26 is a chart showing a relationship in inputs and outputs of the half-adder shown in FIG. 24.
FIG. 27 is a pattern showing determination results of a comparator having a plurality of worm-eaten portions.
Figure 28:
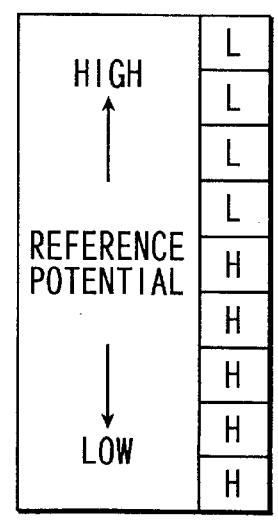
FIG. 28 is a chart showing determination results which are equivalent to those of FIG. 27 obtained by the analog/digital converter apparatus illustrated in FIG. 22.

According to the ninth embodiment, the present invention can be applied to a pattern having a plurality of decayed portions as shown in FIG. 27. This pattern can be regarded equally as that shown in FIG. 28. The pattern of FIG. 28 is a very rational one in which the center of a decayed portion is regarded as an input level.

In the ninth embodiment, the same result is obtained even though, instead of calculating the number of comparators outputting an "H" level, the number of comparators outputting an "L" level is calculated and subtracted from the total number of comparators. The present invention is desirable in that the same advantage as that of the prior art technique is definitely obtained if no decayed portions occur in the determination results of the comparators.

In the flash type analog/digital converter apparatus according to the ninth embodiment, even though a pattern of comparison results of the comparators includes a decayed pattern because of a fluctuation in threshold values determined by the comparators which is due to device mismatch caused at the time of the manufacture, the final digital output value can be determined uniquely.

The inventions of the first, fourth and fifth embodiments, i.e., the invention of resolving a problem of equivalent input offset of the comparators, the inventions of the second, third, sixth, and eighth embodiments, i.e., the invention of resolving a problem of mismatch of elements constituting a reference voltage generator, and the invention of the ninth embodiment, i.e., the invention of resolving a problem of thermal fluctuations, have their respective advantages. If, therefore, these advantages are combined, a more effective, high-precision analog/digital converter apparatus can be realized.

As has been described above, in the analog/digital converter apparatus according to the present invention, since an influence of equivalent input offset of the comparators for comparing an input analog signal and a reference signal is canceled, the precision of conversion restricted by the level of the equivalent input offset can be heightened. Since, furthermore, the arrangement of elements constituting a reference voltage generator is varied freely, mismatches between the elements can be averaged and reduced. Since, moreover, the signals are differentiated, the apparatus is hard to be influenced by noise. Consequently, the analog/digital converter apparatus can be decreased in costs and improved in conversion precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog-to-digital converter apparatus, comprising:
    a reference signal generator section which generates a plurality of reference signals;
    a comparator section which determines a relationship in level between an input analog signal and the reference signal and outputs a comparison result; and
    an encoder which converts the comparison result into a digital signal,
    wherein said comparator section includes:
        a comparator which compares the input analog signal with the reference signal in first and second modes, and
        a switching section which switches first and second signal lines for supplying the input analog signal and the reference signal in the first and second modes.

2. The analog-to-digital converter apparatus according to claim 1, wherein said comparator section, comprises:
    a differential amplifier connected to said switching section;
    an analog signal holding section for holding an analog signal output from said differential amplifier;
    a sign inverter section which inverts a sign of the analog signal to output an inverted analog signal; and
    an adder section which adds the inverted analog signal and the analog signal output from said differential amplifier and supplies an addition result to said comparator.

3. The analog-to-digital converter apparatus according to claim 1, further comprising an averaging section interposed between said switching section and said comparator,
    wherein said averaging section averages a plurality of signals input to said comparator from said switching section.

4. The analog-to-digital converter apparatus according to claim 3, wherein said comparator section, comprises:
    a differential amplifier connected to said switching section;
    an analog signal holding section which holds an analog signal output from said differential amplifier;
    a sign inverter section which inverts a sign of the analog signal to output an inverted analog signal; and
    an adder section for adding the inverted analog signal and the analog signal output from said differential amplifier and supplying an addition result to said comparator.

5. The analog-to-digital converter apparatus according to claim 4, wherein said comparator section includes a plurality of offset canceling circuits each of which cancels an equivalent input offset of said comparator.

6. The analog-to-digital converter apparatus according to claim 3, wherein said differential amplifier has differential input terminals of at least two channels.

7. The analog-to-digital converter apparatus according to claim 4, wherein said comparator section, comprises:
- a differential amplifier connected to said switching section;
- a switching section which switches an output signal of said differential amplifier;
- an analog signal holding section which holds an analog signal output from said differential amplifier; and
- an adder section which adds the analog signal output from said analog signal holding section and the output signal of said differential amplifier and supplies an addition result to said comparator.

8. The analog-to-digital converter apparatus according to claim 7, wherein said differential amplifier has differential input terminals of at lease two channels.

9. The analog-to-digital converter apparatus according to claim 7, wherein said comparator section includes a plurality of offset canceling circuits each of which cancels an equivalent input offset of said comparator.

10. The analog-to-digital converter apparatus according to claim 9, wherein said differential amplifier has differential input terminals of at least two channels.

11. An analog-to-digital converter apparatus, comprising:
- a reference signal generator section which generates a reference signal;
- a comparator section which determines a relationship in level between an input analog signal and the reference signal and outputs a comparison result; and
- an encoder which converts the comparison result into a digital signal,
- wherein said comparator section includes:
  - a comparator which compares the input analog signal with the reference signal,
  - a switching section which switches a line guiding the input analog signal and the reference signal,
  - a differential amplifier connected to said switching section,
  - an analog signal holding section for holding an analog signal output from said differential amplifier,
  - a sign inverter section which inverts a sign of the analog signal to output an inverted analog signal, and
  - an adder section which adds the inverted analog signal and the analog signal output from said differential amplifier and supplies an addition result to said comparator.

12. An analog-to-digital converter apparatus, comprising:
- a reference signal generator section which generates a reference signal;
- a comparator section which determines a relationship in level between an input analog signal and the reference signal and outputs a comparison result; and
- an encoder which converts the comparison result into a digital signal,
- wherein said comparator section includes:
  - a comparator which compares the input analog signal with the reference signal, and
  - a switching section which switches a line guiding the input analog signal and the reference signal,
  - an averaging section is interposed between said switching section and said comparator, and
  - said averaging section averages a plurality of signals input to said comparator from said switching section.

13. The analog-to-digital converter apparatus according to claim 12, wherein said comparator section includes:
- a differential amplifier connected to said switching section,
- an analog signal holding section which holds an analog signal output from said differential amplifier,
- a sign inverter section which inverts a sign of the analog signal to output an inverted analog signal, and
- an adder section for adding the inverted analog signal and the analog signal output from said differential amplifier and supplying an addition result to said comparator.

14. The analog-to-digital converter apparatus according to claim 13, wherein said comparator section includes a plurality of offset canceling circuits each of which cancels an equivalent input offset of said comparator.

15. The analog-to-digital converter apparatus according to claim 12, wherein said differential amplifier has differential input terminals of at least two channels.

16. The analog-to-digital converter apparatus according to claim 12, wherein said comparator section includes:
- a differential amplifier connected to said switching section,
- a switching section which switches an output signal of said differential amplifier,
- an analog signal holding section which holds an analog signal output from said differential amplifier, and
- an adder section which adds the analog signal output from said analog signal holding section and the output signal of said differential amplifier and supplies an addition result to said comparator.

17. The analog-to-digital converter apparatus according to claim 16, wherein said differential amplifier has differential input terminals of at lease two channels.

18. The analog-to-digital converter apparatus according to claim 16, wherein said comparator section includes a plurality of offset canceling circuits each of which cancels an equivalent input offset of said comparator.

19. The analog-to-digital converter apparatus according to claim 18, wherein said differential amplifier has differential input terminals of at least two channels.

20. An analog-to-digital converter apparatus, comprising:
- a reference signal generator section which is constituted by an array of a plurality of reference elements and generates a plurality of reference signals;
- a switching section which changes a connection of the reference elements to a plurality of output lines and including:
  - a plurality of switching elements arranged in a matrix and including pre-stage switching elements connected to the reference elements, and
  - a switching controller which changes a connection relation among the switching elements;
- a comparator section which determines a relationship in level between an input analog signal and the reference signal; and
- an encoder which converts a comparison result of the comparator section into a digital signal.

21. An analog-to-digital converter apparatus, comprising:
- a reference signal generator section which is constituted by an array of a plurality of reference elements and generates a reference signal;

a switching section which changes a connection of the reference elements to a plurality of output lines;

a comparator section which determines a relationship in level between an input analog signal and the reference signal; and an encoder which converts a comparison result of the comparator section into a digital signal, wherein said reference elements are constituted of N passive elements having the same element value, and said switching section has a changing unit which includes:
a plurality of switching elements arranged in a matrix and including pre-stage switching elements connected to the N passive elements, and
a switching controller which changes a connection of M (M≦N) passive elements to the output lines.

22. An analog-to-digital converter apparatus, comprising:
a reference signal generator section which generates a reference signal;
a switching section which changes a connection of reference elements to a plurality of output lines;
a comparator section which determines a relationship in level between an input analog signal and the reference signal; and
an encoder which converts a comparison result of the comparator section into a digital signal,
wherein said reference signal generator section comprises a plurality of resistors connected in series and a plurality of terminals used for extracting a potential between any two nodes of resistors as the reference signal.

23. An analog-to-digital converter apparatus, comprising:
a reference signal generator section for generating a reference signal;
a comparator section for determining a relationship in level between an input analog signal and the reference signal; and
an encoder for converting a comparison result of said comparator section into a digital signal,
wherein said reference signal generator section includes:
a plurality of reference elements constituted of passive elements or active elements,
a plurality of switching elements arranged in matrix and including pre-stage switching elements connected to the reference elements, and
a switching section which changes a connection relation among the switching elements, and
said comparator section includes:
a comparator for determining a relationship in value between the input analog signal and the reference signal, and
an averaging section which succeeds said comparator and averages a plurality of compared signals generated by changing the connection of the reference elements.

24. The analog-to-digital converter apparatus according to claim 23, wherein said reference elements are constituted of N passive elements having the same element value, and
said reference signal generator section generates the reference signal by changing a connection among M (M≦N) passive elements by means of the switching elements.

25. The analog-to-digital converter apparatus according to claim 23, wherein said reference signal generator section uses a potential difference between two nodes of an array of the reference elements.

26. An analog-to-digital converter apparatus, comprising:
a reference signal generator section including:
a plurality of reference elements constituted of passive elements or active elements, and
a plurality of switching elements connected to the reference elements and arranged in a matrix and including pre-stage switching elements connected to the reference elements, and a switching controller which changes a connection relation among the switching elements,
said reference signal generator section generating a reference signal;
a comparator section for determining a relationship in level between an input analog signal and the reference signal;
an encoder for converting a comparison result of said comparator section into a digital signal; and
an averaging section including:
a switching section which changes a connection among the switching elements and provided on an output side of said encoder,
said averaging section averaging a plurality of signals output from said encoder by changing a connection of the reference elements to output terminals by means of the switching elements.

27. The analog-to-digital converter apparatus according to claim 26, wherein said reference elements are constituted of N passive elements having the same element value, and
said reference signal generator section generates the reference signal by changing a connection among M (M≦N) passive elements.

28. The analog-to-digital converter apparatus according to claim 26, wherein said reference signal generator section uses a potential difference between two nodes of an array of the reference elements.

29. An analog-to-digital converter apparatus, comprising:
a reference signal generator section for generating a reference signal and including:
a plurality of resistors connected in series, and
a plurality of terminals used for extracting a potential between any two nodes of resistors as the reference signal;
a comparator section for determining a relationship in level between an input analog signal and the reference signal; and
an encoder which converts a comparison result of said comparator section into a digital signal,
wherein at least one of the input analog signal and the reference signal is processed as a differential signal.

30. The analog-to-digital converter apparatus according to claim 29, further comprising:
a switching section having a changing unit,
wherein said reference elements are constituted of N passive elements having the same element value, and
said changing unit changes a connection of M (M≦N) passive elements to output lines.

31. The analog-to-digital converter apparatus according to claim 29, wherein said reference signal generator section uses a potential difference between two nodes of an array of the reference elements.

32. An analog-to-digital converter apparatus, comprising:
a plurality of independent reference signal generators, each of which gene rates a reference signal;
a signal comparator section which compares an input analog signal with tile reference signal an d outputs a comparison result;

an encoder section which converts the comparison result into a digital signal;

a selecting section which selects one of the plurality of reference signal generator circuits which is connected to said signal comparator or section; and a control section which controls said selecting section to select one of the reference signal generators in accordance with a predetermined method.

33. The analog-to-digital converter apparatus according to claim 32, wherein said control section outputs a control signal to said selecting section to select the reference signal generators sequentially.

34. The analog-to-digital converter apparatus according to claim 32, wherein said control section outputs a control signal to said selecting section to select the reference signal generators randomly.

35. The at analog-to-digital converter apparatus according to claim 32, wherein said control section includes a controller which controls said selecting section referring to the digital signal to select the reference signal generators in accordance with the digital signal.

36. The analog-to-digital converter apparatus according to claim 35, wherein said control section includes an information holding section which holds used history information of said plurality of reference signal generators, and outputs a signal for controlling said selecting section referring to a content of said information holding section.

37. An analog-to-digital converter apparatus, comprising:

a level comparator section which determines whether each of consecutive input levels is higher or lower than a predetermined threshold level and outputs a plurality of determination results;

a determination section which determines discrete values of the consecutive input levels from the determination results output from said level comparator section; and a calculation section which calculates one of a total number of comparison results corresponding to a level which is higher than the threshold level and a total number of comparison results corresponding to a level which is lower than the threshold level, wherein said determination section determines the discrete values based on a value calculated by said calculation section.

* * * * *